United States Patent
Murayama et al.

(10) Patent No.: US 7,894,201 B2
(45) Date of Patent: Feb. 22, 2011

(54) ELECTRONIC COMPONENT AND METHOD FOR MANUFACTURING THE SAME

(75) Inventors: Kei Murayama, Nagano (JP); Yuichi Taguchi, Nagano (JP); Akinori Shiraishi, Nagano (JP); Masahiro Sunohara, Nagano (JP); Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 580 days.

(21) Appl. No.: 11/943,194

(22) Filed: Nov. 20, 2007

(65) Prior Publication Data

US 2008/0117607 A1 May 22, 2008

(30) Foreign Application Priority Data

Nov. 22, 2006 (JP) ............................. 2006-316202

(51) Int. Cl.
*H05K 1/18* (2006.01)
(52) U.S. Cl. ..................... 361/761; 361/760; 361/783; 361/790; 174/262; 174/259
(58) Field of Classification Search ......... 361/760–764, 361/783, 790, 792, 795, 728, 729, 735, 743, 361/748; 174/262–266, 255–257, 259
See application file for complete search history.

(56) References Cited

U.S. PATENT DOCUMENTS

| | | | | |
|---|---|---|---|---|
| 5,061,987 A | * | 10/1991 | Hsia | 257/702 |
| 7,102,085 B2 | * | 9/2006 | Ohta et al. | 174/260 |
| 2002/0121706 A1 | | 9/2002 | Tatsuta et al. | |
| 2003/0169575 A1 | * | 9/2003 | Ikuta et al. | 361/761 |
| 2004/0080013 A1 | | 4/2004 | Kimura et al. | |
| 2005/0112798 A1 | * | 5/2005 | Bjorbell | 438/106 |
| 2005/0285172 A1 | | 12/2005 | Freeman et al. | |
| 2006/0216856 A1 | | 9/2006 | Zhao | |

FOREIGN PATENT DOCUMENTS

| | | |
|---|---|---|
| DE | 101 63 799 | 7/2002 |
| EP | 0 493 131 | 7/1992 |
| JP | 2000-039371 | 2/2000 |

* cited by examiner

*Primary Examiner*—Dameon E Levi
*Assistant Examiner*—Hoa C Nguyen
(74) *Attorney, Agent, or Firm*—Rankin, Hill & Clark LLP

(57) ABSTRACT

A method of manufacturing an electronic component includes the steps of a) forming a plurality of wiring boards that include first through holes penetrating through a semiconductor substrate and conductive material buried in the first through holes; b) providing conductive projections on the conductive material of any of the plurality of wiring boards; and c) bonding the plurality of wiring boards to each other and electrically connecting the conductive material of the respective wiring boards by the projections.

3 Claims, 12 Drawing Sheets

ELECTRONIC COMPONENT AND METHOD FOR MANUFACTURING THE SAME

This application is based on and claims priority from Japanese Patent Application No. 2006-316202, filed on Nov. 22, 2006, the entire contents of which are hereby incorporated by reference.

BACKGROUND OF THE INVENTION

1. Technical Field

The present disclosure relates to an electronic component using a semiconductor substrate, as well as to a method for manufacturing the same.

2. Background Art

A semiconductor element, such as silicon, is used for; for example, a substrate (interposer) used for mounting electronic elements such as semiconductor elements, in lieu of a ceramic material or a resin material. An interposer which is formed from; e.g., silicon and which is used for mounting electronic elements exhibits superior thermal conductivity than those exhibited by the ceramic material and the resin material. For this reason, when an electronic element to be mounted generates heat, such an interposer has the advantage of exhibiting superior heat dissipation.

Further, a substrate formed from a semiconductor material is more easily precision-fabricated compared with the ceramic material and the resin material, and has an advantage at the time of formation of microstructures. For these reasons, there are cases where an interposer formed from a semiconductor material, such as silicon, is adopted for an especially-miniaturized electronic component. (see e.g., Japanese Patent Unexamined Document: JP-A-2000-39371).

However, particularly for the purpose of forming complicate wiring (a conductive material) for use in mounting elements in the case of formation of an interposer built from a semiconductor substrate, there arises a problem that processes for manufacturing the interposer become more complicated than a case where an interposer built from a related-art resin material is formed.

For instance, when a multilayer structure—into which wiring (the conductive material) for use in mounting elements is stacked into layers—is formed from a semiconductor substrate, processes for forming the wiring (the conductive material) become more complicated when compared with those employed in the case where a resin material is used.

When the processes for manufacturing an interposer are complicated as mentioned above, manufacturing cost increases, and a concern about an increase in manufacturing cost and there arises a decrease in reliability of wiring of an interposer to be formed.

Specifically, the above practical problems arise in the case where a structure—in which wiring (a conductive material) of an interposer enabling mounting of electronic elements or having electronic elements mounted thereon is stacked into layers—is formed using a semiconductor substrate.

SUMMARY OF THE INVENTION

Exemplary embodiments of the present invention provide a novel and useful electronic component and a method for manufacturing the same, which solve the above-described problems A specific challenge to be met by the present invention is to provide a highly-reliable electronic component—which is formed from a semiconductor substrate and which has a multilayer structure—and a method for manufacturing the component.

According to a first aspect of the present invention, the above-described problems are solved by a method of manufacturing an electronic component, including the steps of:

a) forming a plurality of wiring boards that include first through holes penetrating through a semiconductor substrate and conductive material buried in the first through holes;

b) providing conductive projections on the conductive material of any of the plurality of wiring boards; and c) bonding the plurality of wiring boards to each other and electrically connecting the conductive material of the respective wiring boards by the projections.

Further, according to a second aspect of the present invention, the above-described problems are solved by an electronic component including:

a plurality of wiring boards that are provided with through holes penetrating through a semiconductor substrate, the through holes being filled with conductive material; and electrical connection members provided on any of the conductive material of the plurality of wiring boards, wherein the plurality of wiring boards are bonded to each other, and the conductive material of the respective wiring boards are electrically connected to each other by the electrical connection members which are pressed by bonding of the plurality of wiring boards.

The present invention provides a highly-reliable electronic component, which is formed from a semiconductor substrate and has a multilayer structure, and a method for manufacturing the component.

DETAILED DESCRIPTION OF EXEMPLARY EMBODIMENTS

Figure 1A:
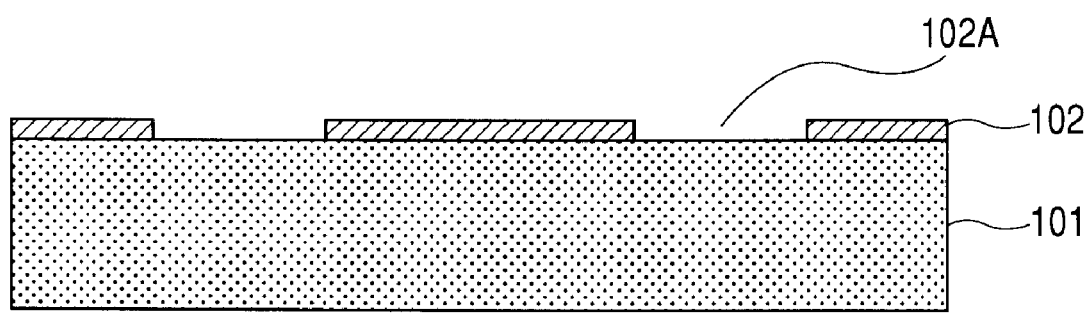
FIG. 1A is a view showing a method for manufacturing an electronic component of a first exemplary embodiment (part 1)

According to the present invention, a method of manufacturing an electronic component includes the steps of:

a) forming a plurality of wiring boards that include first through holes penetrating through a semiconductor substrate and conductive material buried in the first through holes;

b) providing conductive projections on any of the conductive material of the plurality of wiring boards; and c) bonding the plurality of wiring boards to each other and electrically connecting the conductive material of the respective wiring boards by the projections.

Namely, according to the above manufacturing method, an electronic component having a multilayer structure can be readily fabricated by means of bonding the plurality of wiring boards and electrically interconnecting the conductive material buried in the through holes of the plurality of wiring boards. Therefore, related-art complicated processes employed when a multilayer structure is formed in a semiconductor substrate are not required, and the electronic component can be manufactured by way of simple manufacturing processes. Consequently, the cost of manufacture of an electronic component is reduced, and the reliability of an electronic component to be fabricated becomes enhanced.

Further, according to the above manufacturing method, bonding the plurality of wiring boards facilitates sealing of an electronic element into a predetermined space (e.g., a cavity formed in the wiring board). For instance, in the case of a related-art substrate formed from a resin material, it is difficult to seal (enclose) an element to be mounted while preventing intrusion of oxygen, a moisture content, and the like.

In the meantime, according to the manufacturing method, an electronic element can be easily sealed by forming a substrate from a semiconductor material; for example, silicon, and bonding a plurality of substrates.

Namely, the above manufacturing method is characterized by the ability to essentially simultaneously perform 1) bonding of wiring boards, 2) electrical connection of a conductive material (wiring, via plugs, and the like), and 3) sealing of an electronic element to be mounted. Therefore, an electronic component—in which an electronic element is sealed and which has a multilayer structure—can be readily manufactured.

The manufacturing method and the configuration of an electronic component fabricated thereby will now be described by reference to the drawings.

First Exemplary Embodiment

FIGS. 1A through 1J are views showing a method for manufacturing an electronic component of a first exemplary embodiment and the configuration of an electronic component manufactured under the manufacturing method.

In relation to the drawings provided below, there are occasions where the previously-described elements are assigned with the same reference numerals and where their repeated explanations are omitted (the same also applies to embodiments provided below).

First, in a process shown in FIG. 1A, a mask pattern 102 having openings 102A is formed over a semiconductor substrate 101 (e.g., a silicon wafer) made of; e.g., silicon. The mask pattern 102 can be formed by bonding; for example, a film-like resist (a dry film resist) or by patterning a resist layer—which is formed by application of liquid resist coating—through development and exposure by means of photolithography.

Figure 1B:
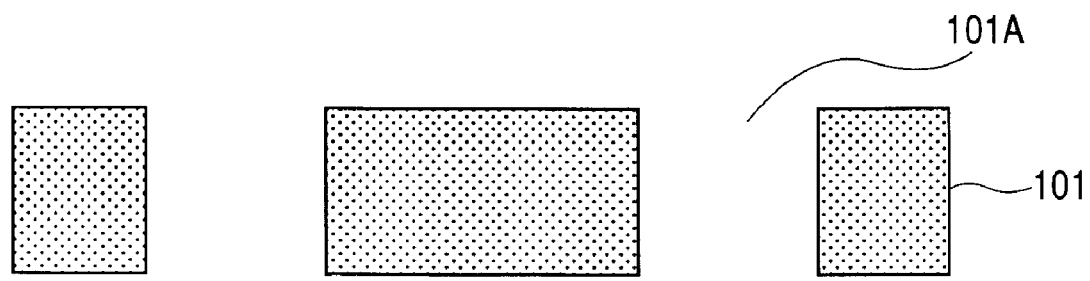
FIG. 1B is a view showing the method for manufacturing an electronic component of the first exemplary embodiment (part 2)

In a process shown in FIG. 1B, the semiconductor substrate 101 is subjected to pattern etching (RIE: Reactive Ion Etching) while the mask pattern 102 serves as a mask. By means of etching, through holes (via holes) 101A penetrating through the semiconductor substrate 101 are formed. The mask pattern 102 is removed (exfoliated) after etching.

Figure 1C:
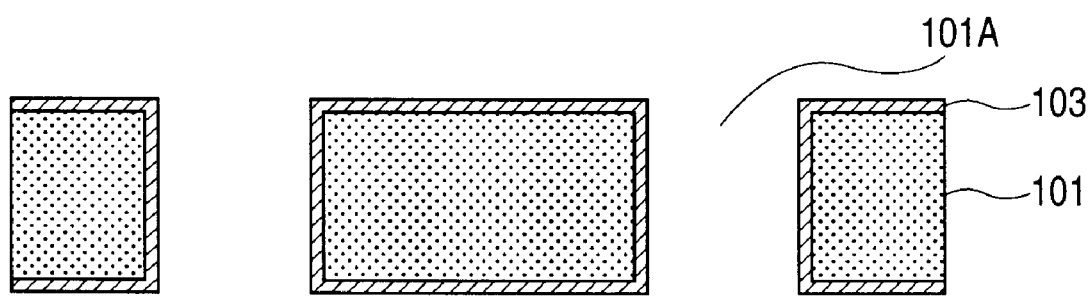
FIG. 1C is a view showing a method for manufacturing an electronic component of the first exemplary embodiment (part 3)

In a step shown in FIG. 1C, an insulation film 103 made of; e.g. a silicon oxide film, is formed on the surface of the semiconductor substrate 101 including interior wall surfaces of the through holes 101A.

Figure 1D:
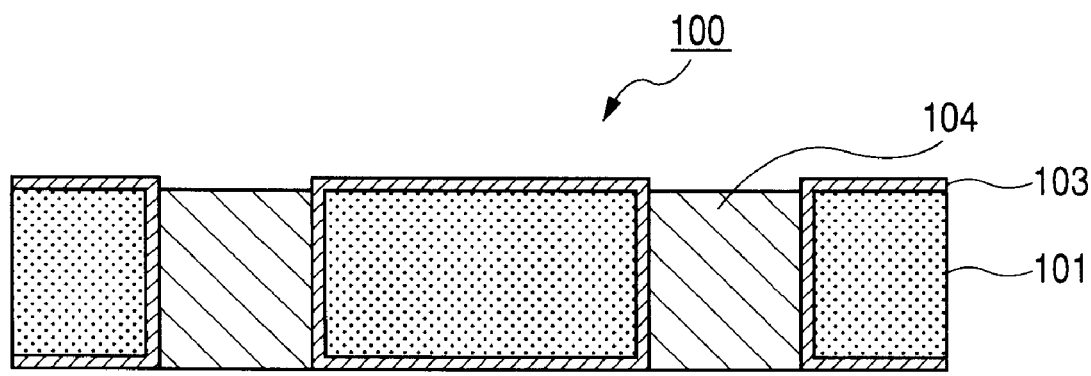
FIG. 1D is a view showing a method for manufacturing an electronic component of the first exemplary embodiment (part 4)

In a step shown in FIG. 1D, a conductive material (a via plug) 104 formed from; e.g., Cu, is buried in the through holes 101A. When the conductive material (the via plug) 104 is formed, the essential requirement is to perform processing provided below.

First, a seed layer (a feeding layer) is formed on the insulation film 103 by means of electroless deposition, and a mask pattern is formed on the seed layer. Subsequently, the conductive material 104 is formed by means of electrolytic plating. The mask pattern and excessive areas of the seed layer which will be exposed as a result of removal of the mask pattern are removed. Thus, a wiring board 100 shown in FIG. 1D is formed.

In following steps, the wiring board 100 is additionally provided with a structure which facilitates electrical connection of the wiring board 100.

Figure 1E:
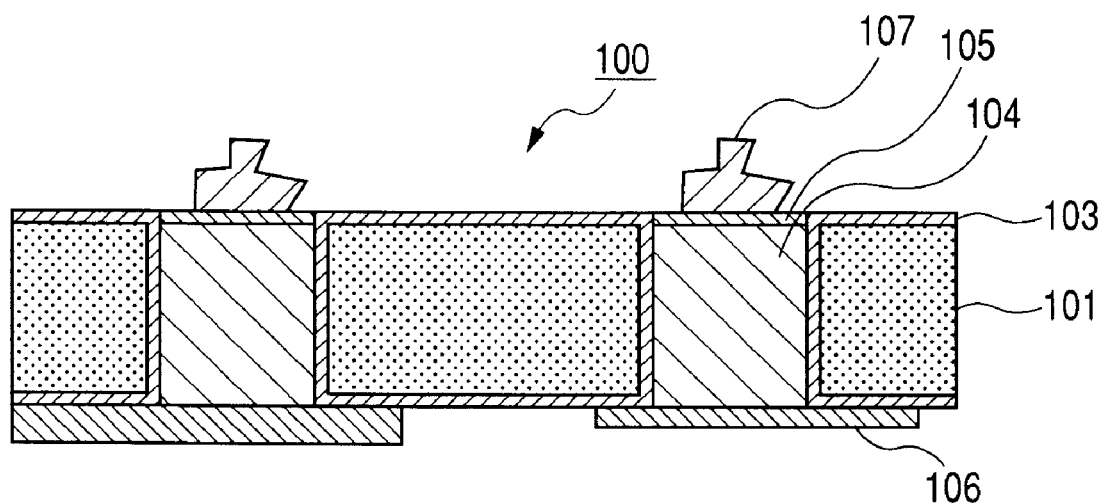
FIG. 1E is a view showing a method for manufacturing an electronic component of the first exemplary embodiment (part 5)

In a step shown in FIG. 1E, metal layers 105 and 106 made of Ni—Au (a multilayer structure including an Au layer and an Ni layer, wherein the Au layer is positioned on an outer side) for facilitating electrical connection are formed on both ends of each conductive material 104.

In this case, the metal layer 105 formed on a surface of the conductive material 104—to which another wiring board is to be bonded in a subsequent step—is preferably formed so as not to protrude from the through hole; for example, in such a way that the surface of the metal layer 105 becomes substantially flush with the surface of the semiconductor substrate 101 (the insulation film 103).

Further, the metal layer 106 formed on the lower end of the conductive material 104 opposite to its upper end is formed so as to extend from the conductive material layer 104 toward the insulation film 103 located outside of the conductive material 104, to thus enable easy formation of an external connection terminal; for example, a solder bump.

Moreover, a projection 107 (which will be sometimes called an electrical connection member or a bump) formed from a bonding wire made of; e.g., Au, is formed on the metal layer 105 by use of; for example, a wire bonding apparatus. The projections 107 are formed by means of continuous connection of the bonding wire to the metal layers 105 and disconnection of the bonding wire. Therefore, the projection 107 is formed in a convex shape (the shape of a projection) upwardly from a bonded portion.

Figure 1F:
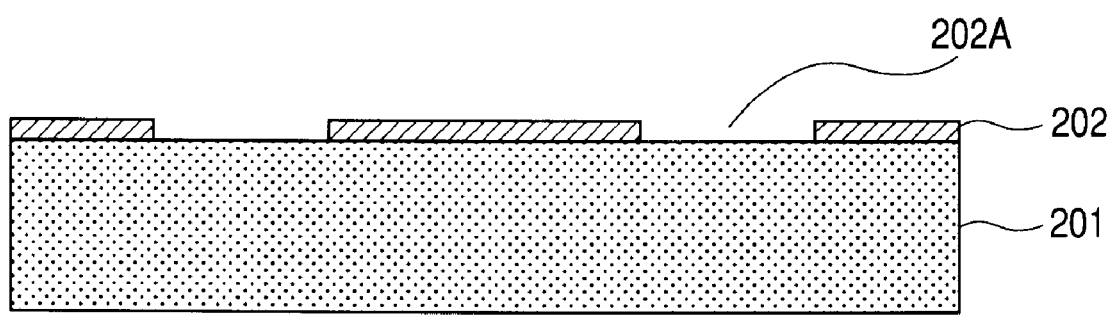
FIG. 1F is a view showing the method for manufacturing an electronic component of the first exemplary embodiment (part 6)

In a step shown in FIG. 1F and subsequent steps, a wiring board to be bonded to the wiring board 100 is formed.

In a step shown in FIG. 1F, a mask pattern 202 having openings 202A is formed, in the same manner as in the step shown in FIG. 1A, over a semiconductor substrate (e.g., a silicon wafer) 201 made of; e.g., silicon. The mask pattern 202 can be formed by bonding; for example, a film-like resist (a dry film resist) or by patterning a resist layer—which is formed by coating liquid resist—through development and exposure by means of photolithography.

Figure 1G:
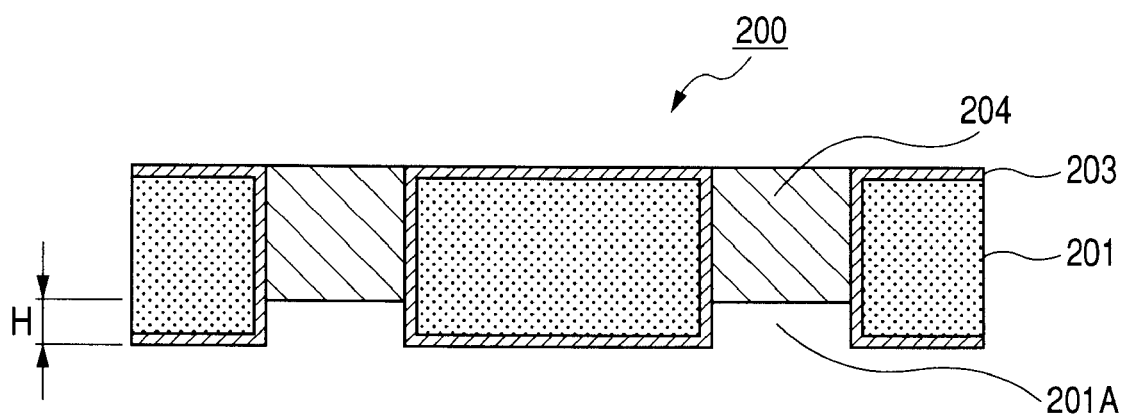
FIG. 1G is a view showing the method for manufacturing an electronic component of the first exemplary embodiment (part 7)

In a step shown in FIG. 1G, through holes (via holes) 201A, an insulation film 203, and a conductive material 204 are formed on the semiconductor substrate 201 in the same manner as in the previously-described processes shown in FIGS. 1B to 1D. The through holes 201A, the insulation film 203, and the conductive material 204 shown in the drawing can be formed in the same manner as are the through holes 101A, the insulation film 103, and the conductive material 104 in the processes shown in FIGS. 1B to 1D. Thus, a wiring board 200 shown in the drawing can be formed.

In the case shown in the drawing, the side (i.e., the lower end in the drawing) of the conductive material 204 that is to be connected to the projection 107 in a subsequent step is preferably formed so as to become recessed in the through hole 201 by a predetermined amount (a height H). The reason for this is that, when the wiring board 100 and the wiring board 200 are bonded to each other, providing a space where the projections 107 are present (pressed) is ensured.

Figure 1H:
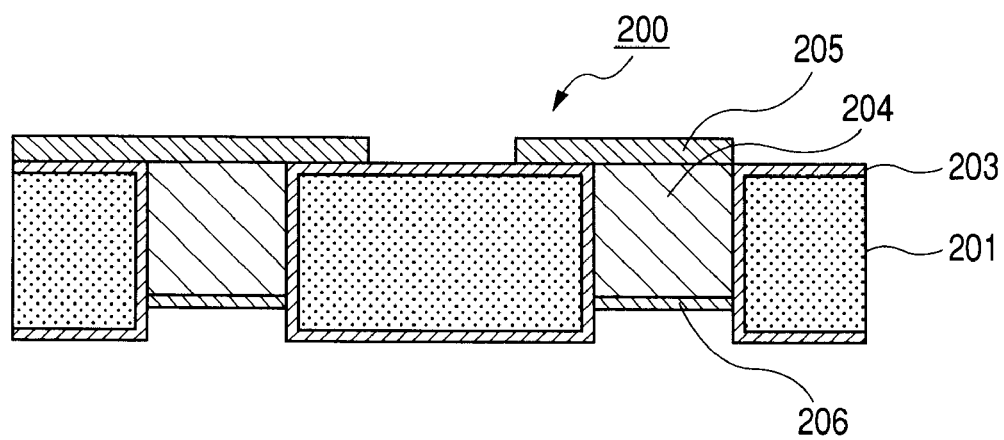
FIG. 1H is a view showing the method for manufacturing an electronic component of the first exemplary embodiment (part 8)

Next, in a step shown in FIG. 1H, metal layers 205 and 206 formed from Ni—Au (a multilayer structure including an Au layer and a Ni layer, and the Au layer is positioned at an exterior side) are formed on both ends of the conductive material 204 in order to facilitate electrical connection.

In this case, the metal layer 206 provided on the side (the lower end in the drawing) of the conductive material 204 to which another wiring board is bonded in a subsequent step is formed in a position recessed in the through hole by a predetermined amount. Moreover, the metal layer 205 formed on the upper end of the conductive material 204 opposite to its lower end is formed so as to extend from the conductive material 204 toward the insulation film 203 located outside of the conductive material 204, to thus enable easy formation of an external connection terminal; for example, a solder bump.

Figure 1I:
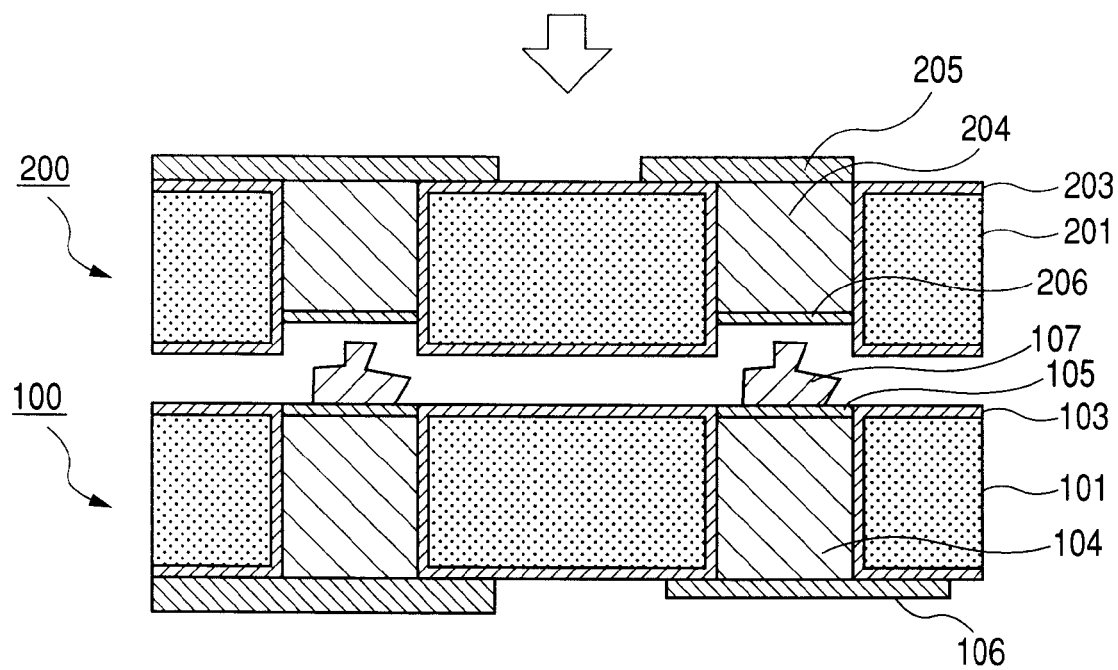
FIG. 1I is a view showing the method for manufacturing an electronic component of the first exemplary embodiment (part 9)

In a step shown in FIG. 1I, the wiring board 100 and the wiring board 200 are bonded together by means of pressing (pressurization) and heating after being positioned in such a way that the projections 107 correspond to the metal layer 206.

For example, when the insulation films 103 and 203 are made of a silicon oxide film, these films can be bonded together by means of pressing and heating with good adhesive force. Alternatively, the insulation films 103 and 203 may also be bonded together while the insulation films 103 and 203 in bonding surface of the films are removed, to thus make silicon exposed. Even in this case, the two wiring boards can be bonded together with superior adhesion force by means of pressurization and heating. Further, the insulation film of any one of the wiring board 100 and the wiring board 200 may also be removed, to thus bring silicon in contact with the silicon oxide film, and these may also be bonded together by means of anodic bonding.

In this process, the projection (the electrical connection member) 107 sandwiched between the conductive material 104 (the metal layer 105) and the conductive material 204 (the metal layer 206) becomes flat by pressurization and heating, to thus be bonded to the metal layer 206. Consequently, the conductive material 104 and the conductive material 204 are electrically connected together through the projection 107.

Figure 1J:
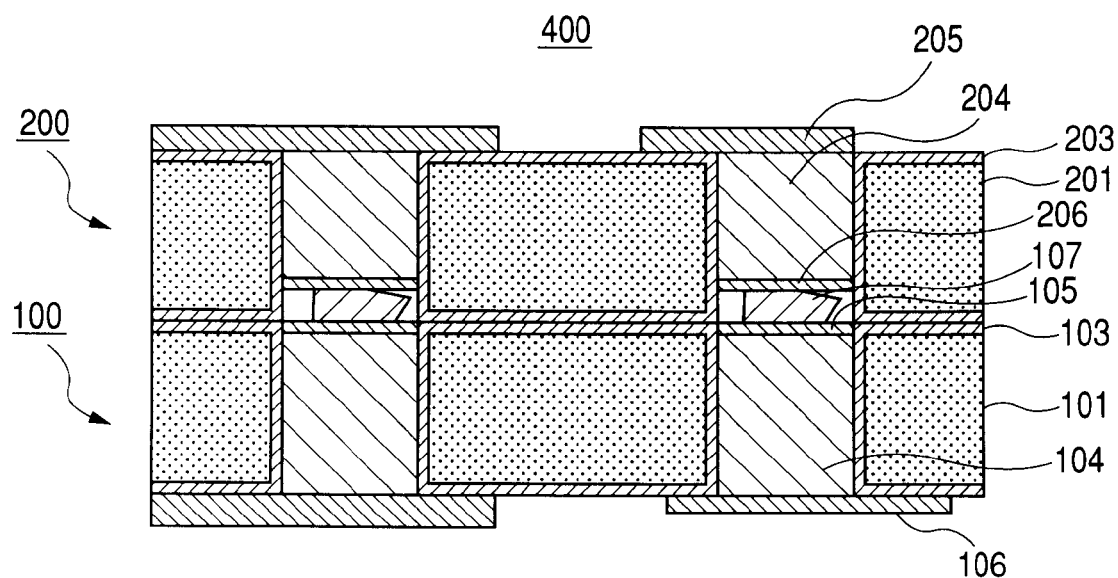
FIG. 1J is a view showing the method for manufacturing an electronic component of the first exemplary embodiment (part 10)

As mentioned above, an electronic component 400 shown in FIG. 1J can be manufactured. The electromc component 400 shown in FIG. 1J is structured such that the wiring board 100 having a structure in which the conductive material 104 is buried in the through holes penetrating through the semiconductor substrate 101 is bonded to the wiring board 200 having a structure in which the conductive material 204 is buried in the through holes penetrating through the semiconductor substrate 201. By means of the projections (the electrical connection sections) 107 which are pressed by means of the above bonding, the conductive material (the via plugs) 104 and the conductive material (the via plugs) 204 are electrically connected to each other.

For example, various electronic elements (e.g., semiconductor elements and the like) are mounted on the metal layer 205, and the metal layer 106 can be electrically connected to an object of connection, such as a mother board, by use of solder bumps. Namely, the electronic component 400 can be used as an interposer which is formed by employing a semiconductor substrate and which has a multilayer structure.

According to the method for manufacturing an electronic component, the plurality of semiconductor substrates (silicon substrates) 101 and 201 are bonded together, and the conductive materials 104 and 204 formed on the respective wiring boards 100 and 200 are electrically connected together by means of the projection conductive material 107, so that an electronic component having a multilayer structure can be fabricated readily.

Specifically, when compared with a related-art method, the method for forming a multilayer structure is made simpler in terms of processes. Hence, the cost of manufacture of an electronic component can be curtailed. Moreover, since the manufacturing processes become simple, the reliability of a manufactured electronic component is enhanced.

Moreover, since the semiconductor material (for example, silicon) exhibits superior thermal conductivity when compared with that exhibited by a ceramic material or a resin material, the semiconductor material has the advantage of effecting superior heat dissipation when a mounted electronic element has generated heat. In short, the semiconductor material is suitable for a case where a high-performance electronic element generating large amounts of heat is mounted.

According to a characteristic of a substrate formed from a semiconductor substrate, it is easier to precision-fabricate the substrate than a ceramic material or a resin material and a minute structure is easily formed. Specifically, the substrate is suitable for a case where a miniaturized high-performance electronic element is mounted.

According to the manufacturing method of the present invention, sealing an electronic element in a predetermined space (e.g. a recess formed in a wiring board) is facilitated by means of bonding a plurality of wiring boards. An embodiment where an electronic element is sealed in a predetermined space will now be described.

Second Exemplary Embodiment

Figure 2A:
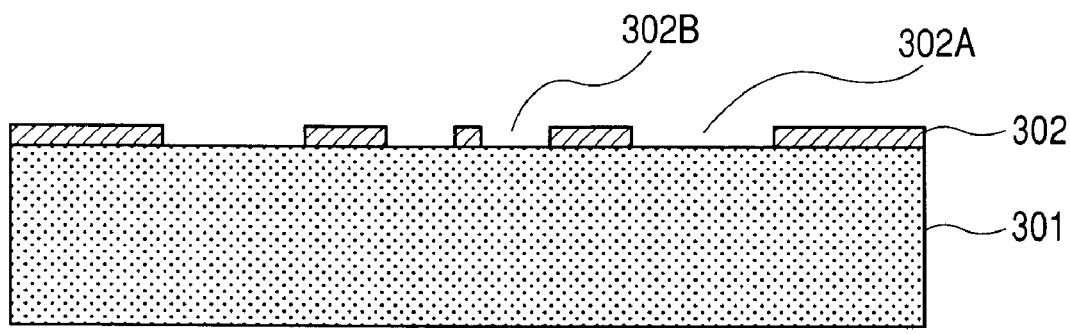
FIG. 2A is a view showing a method for manufacturing an electronic component of a second exemplary embodiment (part 1)

First, in a step shown in FIG. 2A, a mask pattern 302 having openings 302A and 302B is formed over a semiconductor substrate (e.g., a silicon wafer) 301 made of, e.g., silicon. The mask pattern 302 can be formed, for example, by bonding a film-like resist (a dry film resist) or by patterning a resist layer—which is formed by coating liquid resist—through development and exposure by means of photolithography.

Figure 2B:
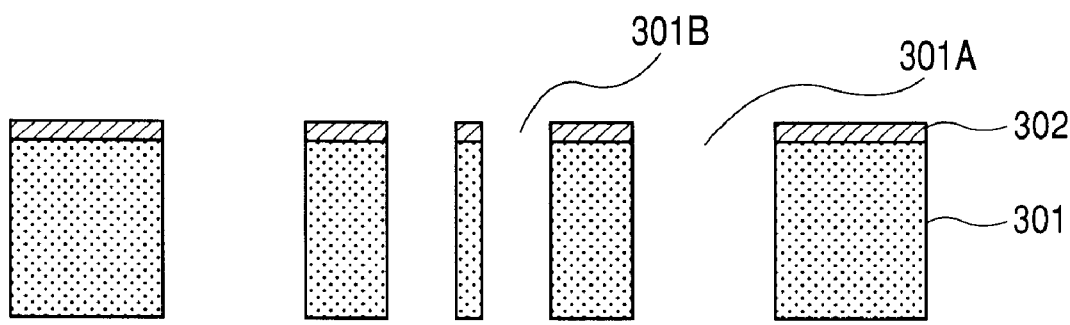
FIG. 2B is a view showing the method for manufacturing an electronic component of the second exemplary embodiment (part 2)

In a step shown in FIG. 2B, a semiconductor substrate 301 is subjected to pattern etching (RIE) while the mask pattern 302 serves as a mask. Through holes (via holes) 301A and 301B penetrating through the semiconductor substrate 301 are formed by means of etching. Further, the through hole 301B is a through hole for mounting an element, and it is used in forming a via plug to which an electronic element mounted in a subsequent step is connected.

Figure 2C:
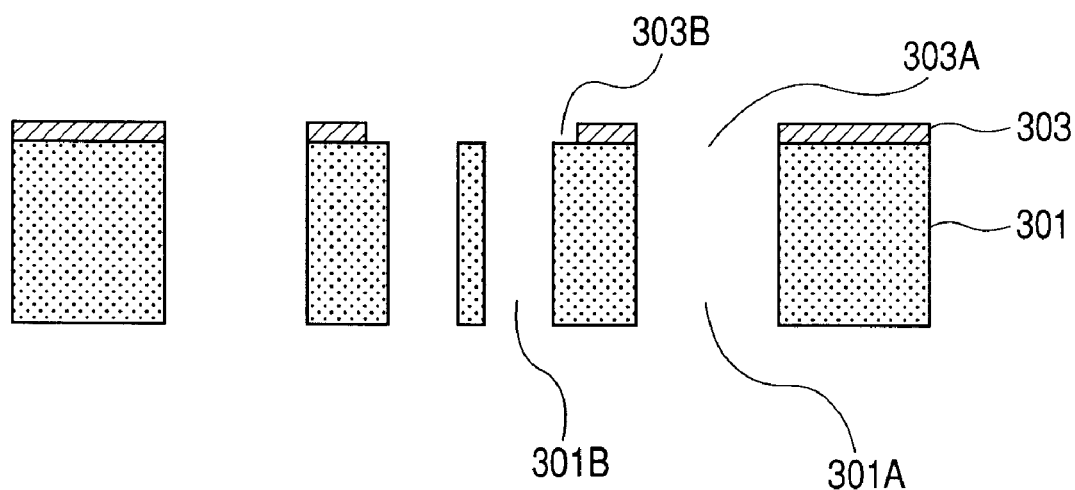
FIG. 2C is a view showing the method for manufacturing an electronic component of the second exemplary embodiment (part 3)

After removal (exfoliation) of the mask pattern 302 in a step shown in FIG. 2C, a new mask pattern 303 is formed on the semiconductor substrate 301. The mask pattern 303 can be formed in the same manner that the mask pattern 302 is formed. Further, the mask pattern 303 is formed so as to be provided with openings 303A and 303B. The opening 303B corresponds to a recess portion (cavity) which will be formed in a subsequent step and where an electronic element is mounted.

Figure 2D:
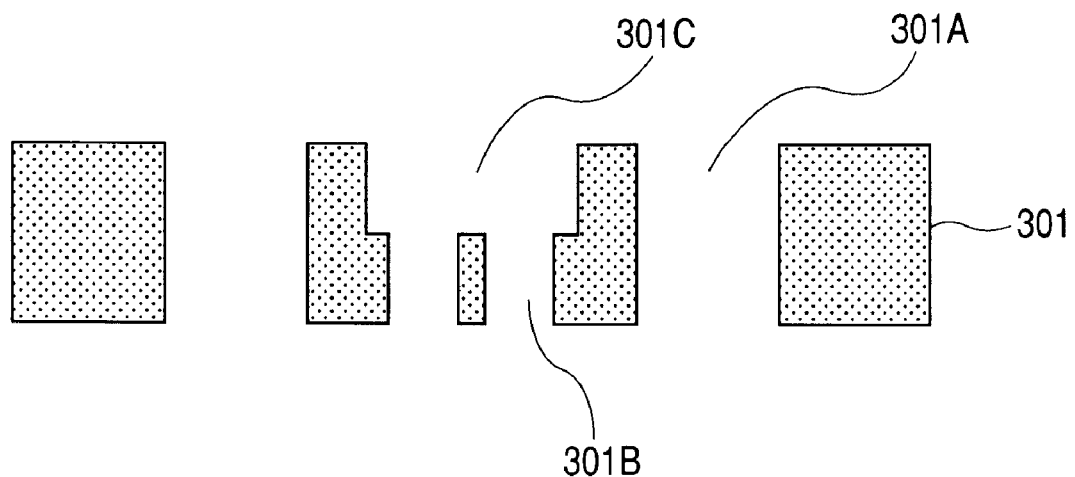
FIG. 2D is a view showing the method for manufacturing an electronic component of the second exemplary embodiment (part 4)

Next, in a step shown in FIG. 2D, the semiconductor substrate 301 is subjected to pattern etching (RIE) while the mask pattern 303 serves as a mask. A recess (cavity) 301C of a predetermined depth is formed in the semiconductor substrate 301. The through holes 301B penetrate through a bottom portion (the semiconductor substrate 301) of the recess 301C. After the above etching, the mask pattern 303 is exfoliated.

Figure 2E:
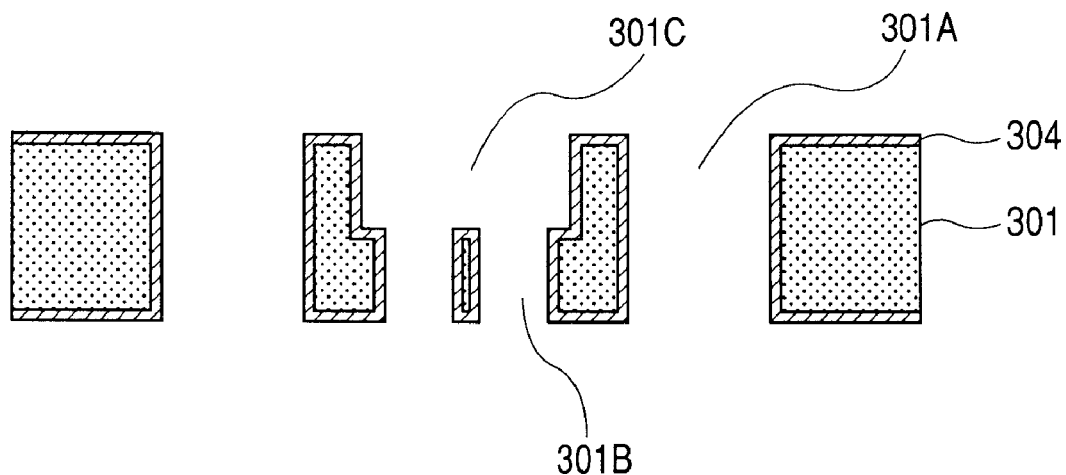
FIG. 2E is a view showing the method for manufacturing an electronic component of the second exemplary embodiment (part 5)

Next, in a step shown in FIG. 2E, an insulation film 304 formed from (for example, a silicon oxide film) is formed on the surface of the semiconductor substrate 301 including an interior wall surface of the recess 301C.

Figure 2F:
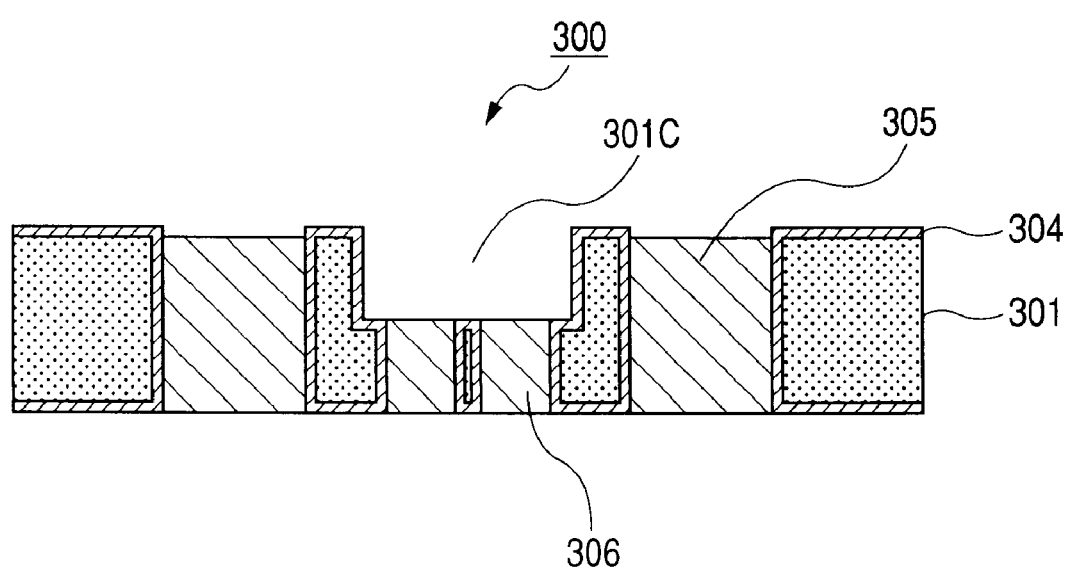
FIG. 2F is a view showing the method for manufacturing an electronic component of the second exemplary embodiment (part 6)

Next, in a step shown in FIG. 2F, a conductive material 305 made of; e.g., Cu, is buried in the through hole 301A, and a conductive material 306 made of; e.g., Cu, is buried in the through hole 301B. The conductive materials (via plugs) 305 and 306 are formed as follows:

First, a seed layer (a feeding layer) is formed on the insulation film 304 by means of electroless plating, and a mask pattern is formed on the seed layer. Subsequently, the conductive materials (via plugs) 305 and 306 are formed by means of electrolytic plating. Further, the mask pattern and excessive areas of the seed layer exposed as a result of removal of the mask pattern are removed. Thus, a wiring board 300 shown in FIG. 2F can be formed.

In subsequent steps, the wiring board 300 is additionally provided with a structure which facilitates electrical connection of the wiring board 300, and an electronic element is further mounted thereon.

Figure 2G:
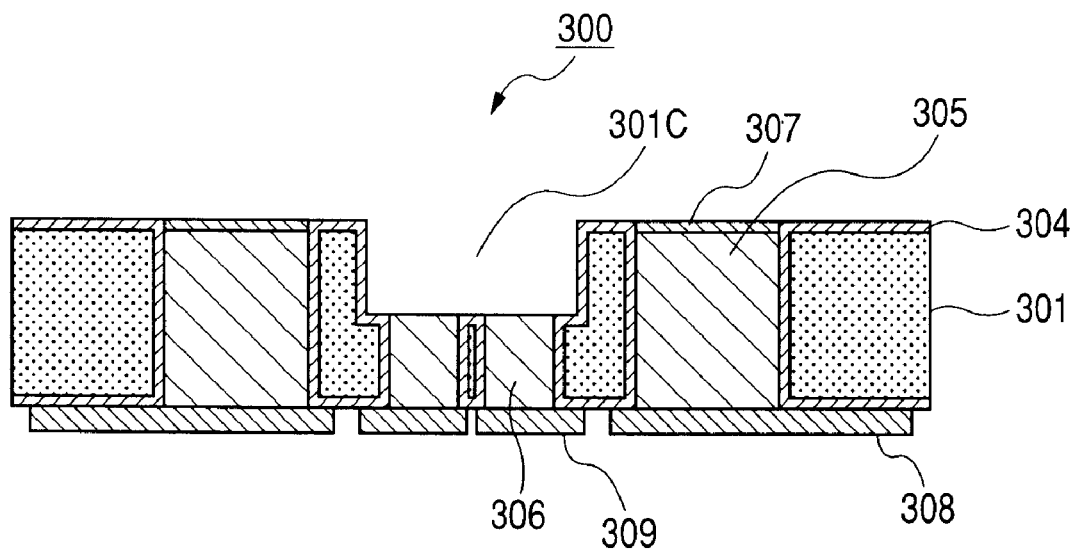
FIG. 2G is a view showing the method for manufacturing an electronic component of the second exemplary embodiment (part 7)
Figure 2H:
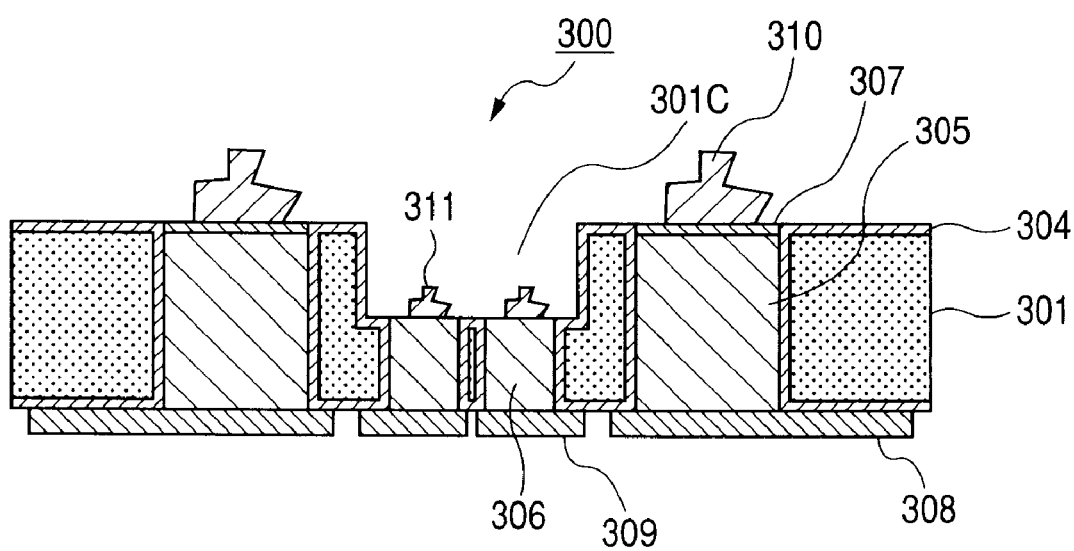
FIG. 2H is a view showing the method for manufacturing an electronic component of the second exemplary embodiment (part 8)

In a step shown in FIG. 2G, metal layers 307 and 308 made of Ni—Au (a multilayer structure including an Au layer and an Ni layer, the Au layer being positioned at an outer side) are formed on both ends of the conductive material 305 in order to facilitate electrical connection.

In this case, the metal layer 307 formed on the side (the upper end in the drawing) of the conductive material 305 to which another wiring board is bonded in a subsequent step is formed so as not to protrude from the through hole. For example, it is preferable that the surface of the metal layer 307 becomes substantially flush with the surface of the semiconductor substrate 301 (the insulation film 304).

Moreover, the metal layer 308 formed on the lower end of the conductive material 305 opposite to its upper end is formed so as to extend from the conductive material 305 toward the insulation film 304 located outside of the conductive material 305, to thus enable easy formation of an external connection terminal such as a solder bump. Further, a metal layer 309 is formed also on the lower end of the conductive material 306 as in the case of the lower end of the conductive material 305.

Next, projections (sometimes called electrical connection members or bumps) 310 and 311 formed from a bonding wire (Au) are formed on the metal layer 307 and the conductive material 306, by use of the wire bonding apparatus. As in the case of the projections 107 of the first exemplary embodiment, the projections 310 and 311 are formed by continuous connection of a bonding wire and disconnection of the bonding wire.

Figure 2I:
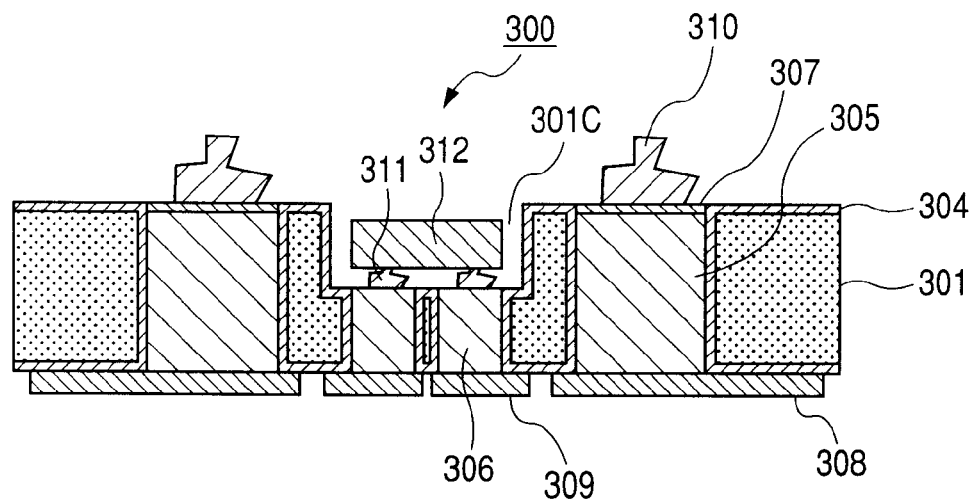
FIG. 2I is a view showing the method for manufacturing an electronic component of the second exemplary embodiment (part 9)

Next, in a step shown in FIG. 2I, an electronic element (e.g., a semiconductor element) 312 is mounted in a recess (cavity) 301C. The electronic element 312 is electrically connected to the conductive material 306 through the projection 311.

Figure 2J:
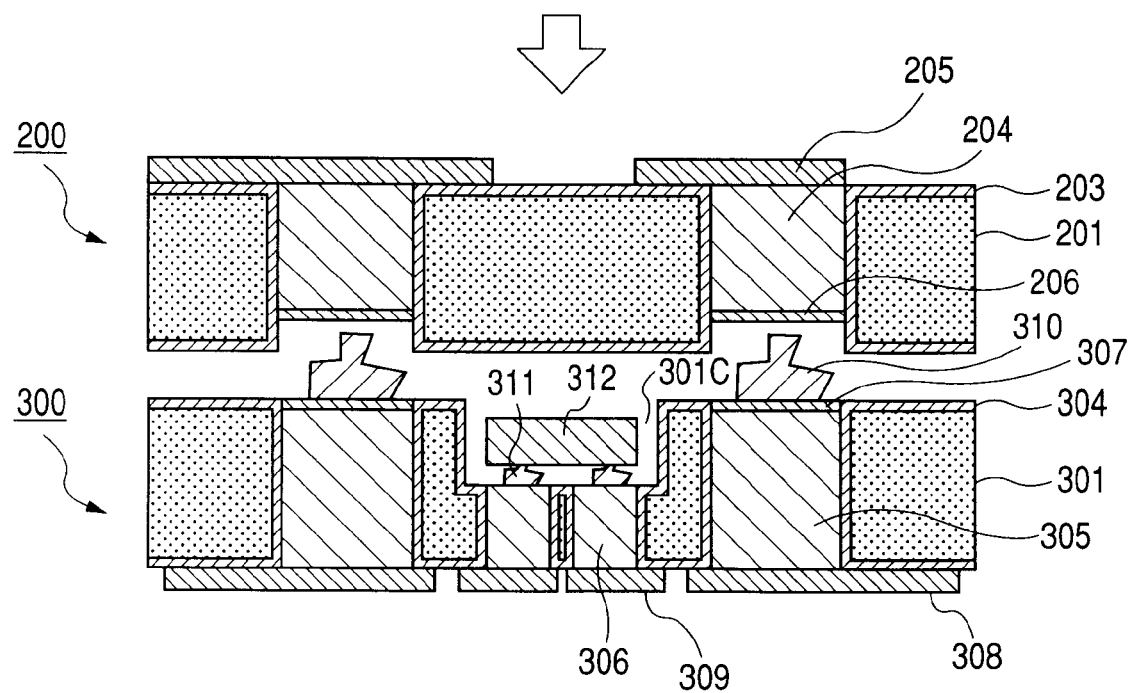
FIG. 2J is a view showing the method for manufacturing an electronic component of the second exemplary embodiment (part 10)

In a step shown in FIG. 2J, the wiring board 300 and the wiring board 200 shown in FIG. 1H of the first exemplary embodiment are positioned so that the projection 310 and the metal layer 206 correspond to each other, and the wiring boards are bonded together by pressing (pressurization) and heating.

When the insulation films 304 and 203 are formed from a silicon oxide film, these films can be bonded to each other with good adhesion force by means of pressurization and heating. Further, the wiring board 300 and the wiring board 200 may also be bonded to each other with silicon being exposed, by removing the insulation films 304 and 203 in bonding areas thereof. Even in this case, the two wiring boards can be bonded together with superior adhesion force by means of pressurization and heating. Further, the insulation film of any one of the wiring board 300 and the wiring board 200 may also be removed, to thus bring silicon in contact with the silicon oxide film, and these may also be bonded together by means of anodic bonding.

In this process, the projection (the electrical connection member) 310 located between the conductive material 305 (the metal layer 307) and the conductive material 204 (the metal layer 206) is subjected to pressurization and heating, to thus become flat and connected to the metal layer 206. Consequently, the conductive material 305 and the conductive material 204 are electrically connected together through the projection 310.

Further, in this step, the electronic element 312 mounted in the recess 301C of the semiconductor substrate 301 is sealed (enclosed) in the recess 301C as a result of bonding the wiring board 300 (the semiconductor substrate 301) and the wiring board 200 (the semiconductor substrate 201) together.

Figure 2K:
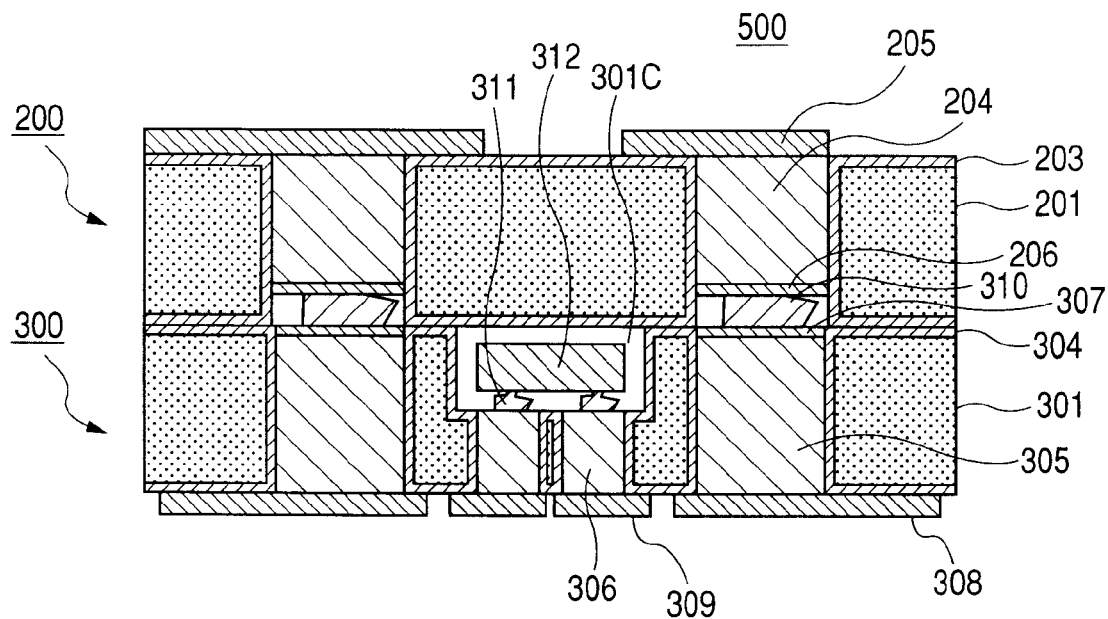
FIG. 2K is a view showing the method for manufacturing an electronic component of the second exemplary embodiment (part 11)

An electronic component 500 shown in FIG. 2K can be thus manufactured. The electronic component 500 shown in FIG. 2K is structured such that the wiring board 300 having a structure in which the conductive material 305 is buried in through holes penetrating through the semiconductor substrate 301 is bonded to the wiring board 200 having a structure in which the conductive material 204 is buried in through holes penetrating through the semiconductor substrate 201. Further, by means of the projection (the electrical connection member) 310 which is pressed by means of the above bonding, the electronic component has a structure of the conductive material (the via plug) 305 and the conductive material (the via plug) 204 being electrically connected together.

The electronic element 500 of the present embodiment is characterized in that the electronic element 312 is sealed in the recess 301C of the wiring board 300.

According to the above-described manufacturing method, in addition to yielding the same characteristics and advantages as those described in connection with the first exemplary embodiment, the method for manufacturing an electronic component facilitates sealing of an electronic element in a predetermined space (e.g., a recess formed in a wiring board) by means of bonding a plurality of wiring boards.

Namely, the manufacturing method is characterized by substantially simultaneously performing, in the step shown in FIG. 2J, 1) bonding of the wiring board 300 and the wiring board 200 (the semiconductor substrate 301 and the semiconductor substrate 201), 2) electrical connection of the conductive materials 305 and 204 of the respective wiring boards 300 and 200, and 3) sealing of an electronic element 312 to be mounted.

Therefore, an electronic component—in which an electronic element is sealed and which has a multilayer structure—can be manufactured readily.

For example, in the case of a substrate made of a related-art resin material, it is difficult to seal (enclose) an element to be mounted with avoiding from intrusion of oxygen or a moisture.

In the meantime, according to the above-described manufacturing method, sealing of an electronic element, which is preferably used in a sealed manner, is facilitated by using a semiconductor material (e.g., silicon). And then, the electronic element is typified by an MEMS (Micro Electro Mechanical Systems) element and an optical-functional element (a light-emitting element or a light-receiving element).

Further, for example, the manufacturing method (or the electronic component) of the present embodiment can be modified or altered as follows.

Third Exemplary Embodiment

Figure 3:
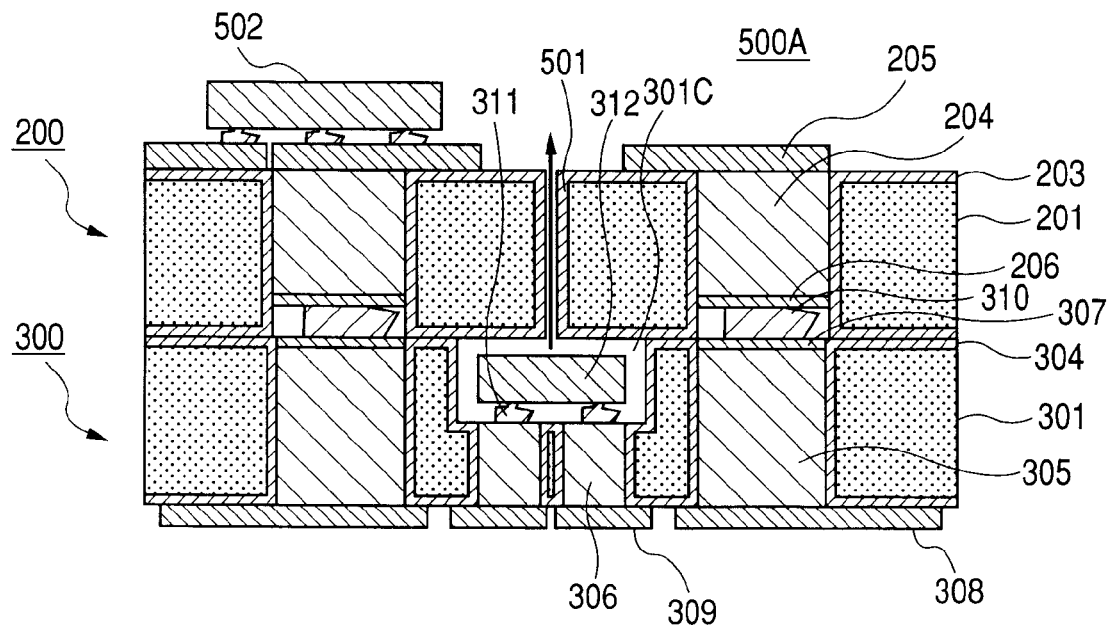
FIG. 3 is a view showing an electronic component of a third exemplary embodiment.

FIG. 3 is a view showing an electronic component 500A of a third exemplary embodiment. By reference to FIG. 3, the electronic component 500A of the present embodiment differs from the electronic component 500 of the second exemplary embodiment in following points.

First, in the present embodiment, openings 501 penetrating through the semiconductor substrate 201 are formed in the semiconductor substrate 201 (the wiring board 200).

For example, when the electronic element 312 is an optical-functional element, the openings 501 serve as opening sections for allowing entrance of light into the optical-functional element (the electronic element 312) or exit of light from the optical-functional element. Namely, when the electronic element 312 is a light-receiving element, the openings 501 are used for allowing entrance of light into a light-receiving element. When the electronic element 312 is a light-emitting element, the openings 501 are used for allowing exit of light from the light-emitting element.

In the steps shown in FIGS. 1F and 1G of the first exemplary embodiment, it is required to form the openings 501 simultaneously with formation of the through holes 201A. In order to seal the electronic element 312, an optically-transparent cover may also be provided on each of the opening sections 501.

In the electronic component 500A of the present embodiment, an electronic element 502 is mounted on a surface opposite to the surface of the wiring board 200 (the semiconductor substrate 201) facing the recess 301C, wherein the wiring board 200 is bonded to the wiring board 300 having the recess 301C formed therein.

As mentioned above, the electronic component of the present invention can mount not only an electronic element to be sealed but also various other electronic elements. For instance, when the electronic element 312 is an MEMS element, a drive element of the MEMS element can be mounted as in the case of the electronic element 512.

Fourth Exemplary Embodiment

Figure 4:
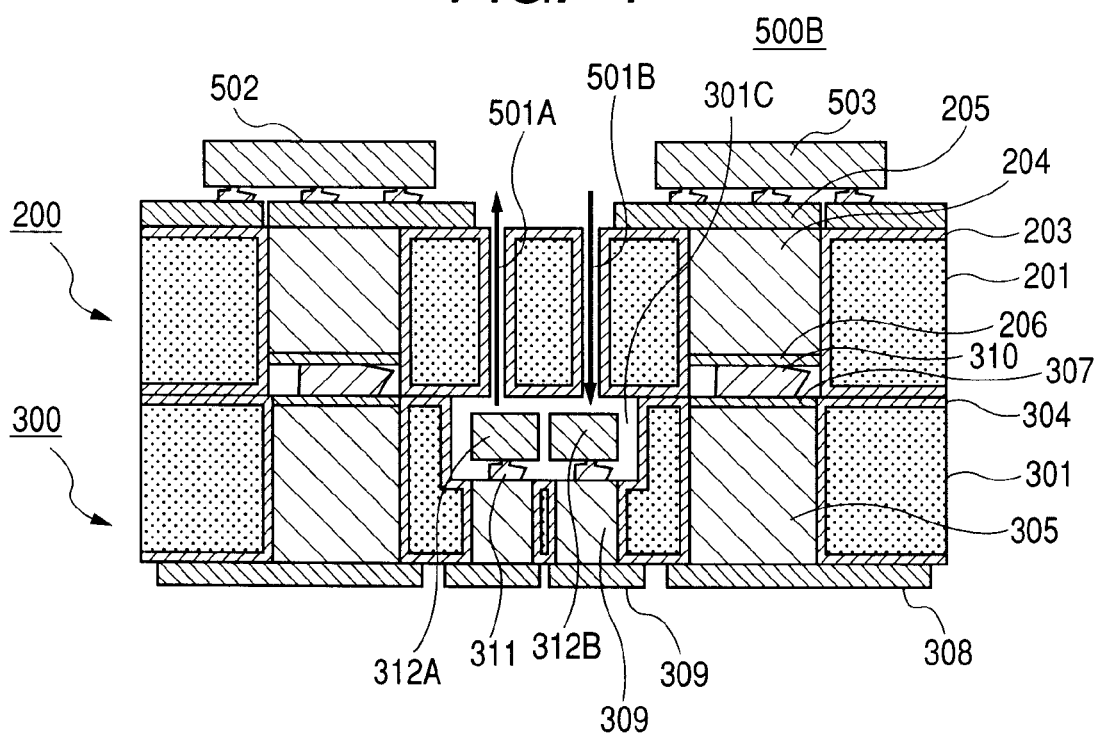
FIG. 4 is a view showing an electronic component of a fourth exemplary embodiment.

FIG. 4 is a view showing an electronic component 500B of a fourth exemplary embodiment. By reference to FIG. 4, the electronic component 500B of the present embodiment differs from the electronic component 500A of the third exemplary embodiment in the following points.

First, in the present embodiment, there are a plurality of electronic elements to be mounted in a recess 301C (i.e., electronic elements 312A and 312B). A plurality of openings (openings 501A and 501B) penetrating through the semiconductor substrate 201 (the wiring board 200) are formed in correspondence to the electronic elements. For example, when the electronic element 312A is a light-emitting element, the opening 501A is used for allowing exit of light from the light-emitting element. Moreover, when the electronic element 312B is a light-receiving element, the opening section 501B is used for allowing entrance of light to the light-receiving element. As mentioned above, the plurality of electronic elements, such as a light-emitting element and a light-receiving element, may also be mounted on an electronic component. Further, when there are a plurality of light-emitting elements to be mounted, a plurality of openings may also be formed in correspondence to the elements in the wiring board.

In addition to the previously-described electronic element 502, the electronic component 500B of the present embodiment is provided with an electronic element 503. As mentioned above, the number of electronic elements mounted on the wiring board 200 is not limited to one, and the electronic elements may also be in numbers.

Fifth Exemplary Embodiment

Figure 5:
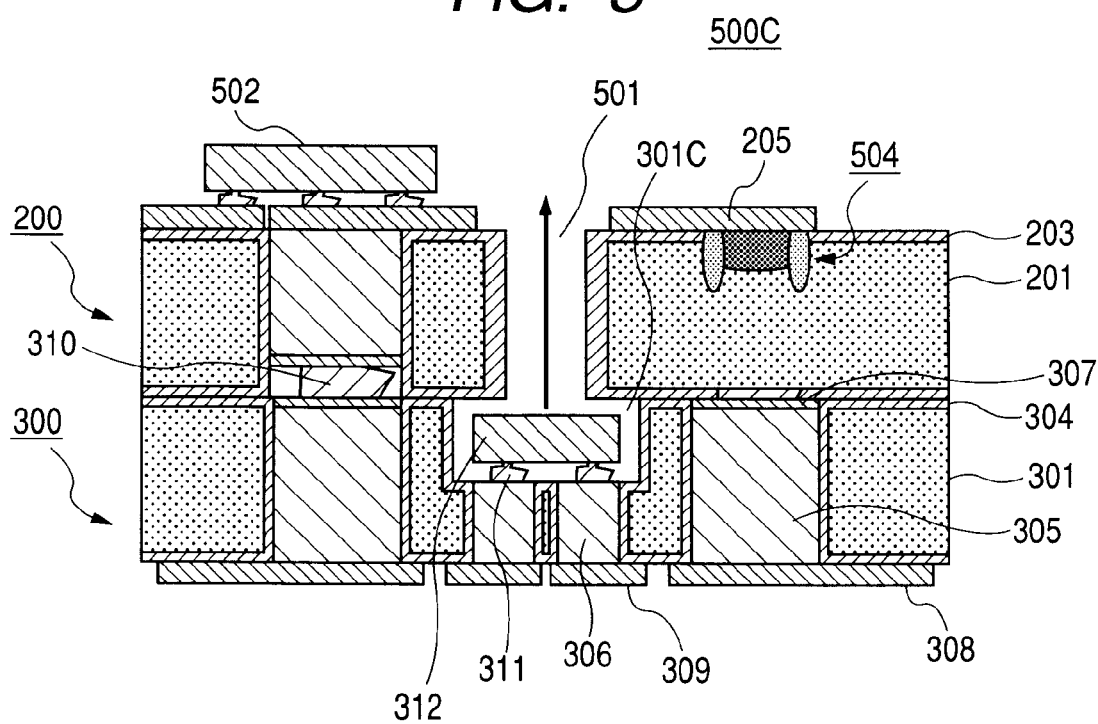
FIG. 5 is a view showing an electronic component of a fifth exemplary embodiment.

FIG. 5 is a view showing an electronic component 500C of a fifth exemplary embodiment. By reference to FIG. 5, the electronic component 500C of the present embodiment differs from the electronic component 500A of the third exemplary embodiment in the following points.

The electronic component 500C of the present embodiment is characterized in that a device (e.g., a Zener diode) 504 having a plurality of dopant diffusion areas of different concentrations or conductivity types is fabricated in the semiconductor substrate 201 (the wiring board 200).

Namely, the electronic component 500C of the present embodiment is characterized in that a predetermined device (a diode, or the like) is fabricated by use of a semiconductor material (silicon) constituting a semiconductor substrate on which electronic elements are mounted. The device is used with being connected with electronic elements to be mounted on the semiconductor substrate.

Therefore, in the electronic component 500C of the present embodiment, the number of elements to be surface-mounted is reduced. Specifically, the present embodiment enables miniaturization and weight-reduction of an electronic component.

In the present embodiments, the number of semiconductor substrates to be bonded together is not limited to two. An electronic component having a larger number of layers may also be configured by means of bonding three or more semiconductor substrates. Furthermore, the semiconductor substrate used in the above manufacturing method (or the electronic component) is not limited to a silicon substrate, and another semiconductor substrate (e.g., SiGe or the like) may also be used.

According to the present invention, it is possible to provide a highly-reliable electronic component which is formed by use of a semiconductor substrate and which has a multilayer structure and a method for manufacturing the component.

While there has been described in connection with the exemplary embodiments of the present invention, it will be obvious to those skilled in the art that various changes and modification may be made therein without departing from the present invention. It is aimed, therefore, to cover in the appended claim all such changes and modifications as fall within the true spirit and scope of the present invention.

What is claimed is:

1. An electronic component comprising:
   a plurality of wiring boards each comprising a semiconductor substrate, the wiring boards provided with first through holes penetrating the respective semiconductor substrate, the first through holes being filled with conductive material;
   an electronic element mounted in a recess portion formed in any of the plurality of semiconductor substrates;
   a second through hole formed in a bottom of the recess portion of the semiconductor substrate, the second through hole being filled with the conductive material; and
   electrical connection members provided on any of the conductive material of the plurality of wiring boards,
   wherein the plurality of wiring boards are bonded to each other, and the conductive material of the respective wiring boards are electrically connected to each other by the electrical connection members which are pressed by the bonded plurality of wiring boards,
   wherein the electronic element is sealed in the recess portion by the bonded semiconductor substrates, and
   wherein the electronic element is arranged on the electrical connection member arranged on the conductive material in the second through hole to contact the electronic element with the conductive material.

2. The electronic component according to claim 1, wherein the electronic element is an optical-functional element, and an opening used for entrance/exit of light into/from the optical-functional element is formed in any of the plurality of wiring boards.

3. The electronic component according to claim 2, wherein the plurality of wiring boards includes a first wiring board having the recess portion and a second wiring board having a first surface and a second surface opposite to the first surface, wherein the first surface of the second wiring board is bonded to the first wiring board, and wherein another electronic element is mounted on the second surface of the second wiring board.

* * * * *